(12) United States Patent
Peizerat

(10) Patent No.: US 11,050,957 B2
(45) Date of Patent: Jun. 29, 2021

(54) WIDE DYNAMIC RANGE IMAGE SENSOR

(71) Applicant: Commissariat à l'Énergie Atomique et aux Énergies Alternatives, Paris (FR)

(72) Inventor: Arnaud Peizerat, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 16/167,136

(22) Filed: Oct. 22, 2018

(65) Prior Publication Data

US 2019/0158718 A1   May 23, 2019

(30) Foreign Application Priority Data

Nov. 21, 2017   (FR) ...................................... 1760992

(51) Int. Cl.
| | |
|---|---|
| *H04N 5/235* | (2006.01) |
| *H04N 5/3745* | (2011.01) |
| *H04N 5/353* | (2011.01) |
| *H04N 5/359* | (2011.01) |
| *H01L 27/146* | (2006.01) |
| *H04N 5/355* | (2011.01) |
| *H04N 5/378* | (2011.01) |

(52) U.S. Cl.
CPC ..... *H04N 5/3592* (2013.01); *H01L 27/14643* (2013.01); *H04N 5/2355* (2013.01); *H04N 5/355* (2013.01); *H04N 5/3535* (2013.01); *H04N 5/378* (2013.01); *H04N 5/3745* (2013.01); *H04N 5/37455* (2013.01)

(58) Field of Classification Search
None
See application file for complete search history.

(56) References Cited

U.S. PATENT DOCUMENTS

| | | | |
|---|---|---|---|
| 7,514,716 | B2 | 4/2009 | Panicacci |
| 9,344,635 | B2 | 5/2016 | Vogelsang et al. |
| 2008/0074524 | A1* | 3/2008 | Panicacci .......... H01L 27/14609 |
| | | | 348/308 |

FOREIGN PATENT DOCUMENTS

EP            3 139 595 A1    3/2017

OTHER PUBLICATIONS

French Search Report dated Jun. 15, 2018 in connection with Application No. 1760992.
Yang et al., High Dynamic Range CMOS Image Sensor with Conditional Reset. IEEE 2002 Custom Integrated Circuits Conference. pp. 265-268.

* cited by examiner

*Primary Examiner* — Mark T Monk
(74) *Attorney, Agent, or Firm* — Wolf, Greenfield & Sacks, P.C.

(57) ABSTRACT

An image sensor including pixels, each pixel including a photodetector and a circuit for reading out the quantity of charges collected by the photodetector at the end of a phase of charge collection by the photodetector. The image sensor further includes, for at least one of the pixels, a detection circuit capable, at least at two different times during the phase, of detecting whether the quantity of charges collected at the time by the photodetector of the pixel exceeds a threshold and, in the case where the quantity of charges collected at the time exceeds the threshold, of storing a first signal representative of the time and of resetting the photodetector.

11 Claims, 4 Drawing Sheets

WIDE DYNAMIC RANGE IMAGE SENSOR

This application claims the priority benefit of French patent application number 17/60992, the content of which is hereby incorporated by reference in its entirety to the maximum extent allowable by law.

BACKGROUND

The present disclosure relates to an image sensor, or imaging device, having a wide dynamic range. It particularly applies to CMOS imagers manufactured in silicon technology comprising pixels of small dimensions and capable of performing an optical detection in the visible range.

DISCUSSION OF THE RELATED ART

A wide dynamic range image sensor is an image sensor designed to be sensitive to an extensive luminance dynamic range in a same image acquired by its photosensitive sensors. The acquired image is thus neither overexposed in its areas of high light intensity, nor underexposed in its areas of low light intensity: it comprises detailed information both in the two types of extreme areas of the image. The dynamic range of the image sensor may be increased by decreasing the noise floor of the pixels or by increasing the pixel saturation limit.

The image sensor may implement a method called dynamic range extension method, which enables the image sensor to accept higher luminosities than those which would be accepted by only taking into account the pixel saturation limit.

The phase during which the pixel collects charges under the action of an incident radiation is called integration phase of the pixel. The integration phase is generally followed by a readout phase during which the quantity of charges collected by the pixels is measured. For certain applications, it may be desirable for the image sensor to be of global shutter type, that is, implementing an image acquisition method where the beginnings and ends of pixel integration phases are simultaneous.

For certain applications, it may be desirable to carry out, simultaneously to a pixel integration phase, a readout phase during which the quantity of charges collected by the pixel during the integration phase preceding the current integration phase is measured. Such a method is called IWR, for Integrating While Reading. Such a method enables to increase the image sensor speed, that is, the number of images acquired per second, or FR, for Frame Rate, or FPS, for Frame Per Second.

Patent U.S. Pat. No. 7,514,716 describes an image sensor implementing a dynamic range extension method. This method comprises measuring the quantity of charges stored in a pixel of the image sensor at given times during the pixel integration phase, comparing the measured values with a threshold, and resetting or not the pixel according to the result of this comparison. When the pixel is reset, data representative of the integration time elapsed at the time of the resetting are stored. A disadvantage of the dynamic range extension method described in patent U.S. Pat. No. 7,514,716 is that the data representative of the integration time at the time of the resetting are stored in analog fashion on the sense node of the pixel. It is then not possible to implement an IWR method.

SUMMARY

Thus, an object of an embodiment is to provide an image sensor which overcomes at least some of the disadvantages of the previously-described image sensors.

Another object of an embodiment is to increase the dynamic range of the image sensor.

Another object of an embodiment is for the image sensor to implement a dynamic range extension method.

Another object of an embodiment is for the image sensor to be of global shutter type.

Another object of an embodiment is for the image sensor to implement an IWR-type pixel readout method.

Another object of an embodiment is not to modify the pixel structure with respect to an image sensor of global shutter type.

Thus, an embodiment provides an image sensor comprising pixels, each pixel comprising a photodetector and a circuit for reading out the quantity of charges collected by the photodetector at the end of a phase of charge collection by the photodetector, the image sensor further comprising, for at least one of the pixels, a detection circuit capable, at least at each of two different times during said phase, of detecting whether the quantity of charges collected at said time by the photodetector of said pixel exceeds a threshold and, in the case where said quantity of charges collected at said time exceeds the threshold, of storing a first signal representative of said time and of resetting the photodetector.

According to an embodiment, for each pixel, the readout circuit comprises at least one first transistor coupling the photodetector to a first node and each pixel further comprises a second transistor coupling the photodetector to a second node, said second node of at least one of the pixels being coupled to the detection circuit.

According to an embodiment, the image sensor further comprises a third transistor coupling the second node to a source of a first reference potential.

According to an embodiment, the detection circuit is capable, for each of said times, of making the second transistor at least partially conductive, the third transistor then being non-conductive, and then of making the second transistor and the third transistor conductive in the case where the quantity of charges collected at said time exceeds said threshold.

According to an embodiment, the image sensor comprises a comparator and a circuit for controlling the second transistor from the signal supplied by the comparator.

According to an embodiment, the image sensor comprises a first source of a first discrete signal having a plurality of first levels and the detection circuit is capable of controlling the second transistor with one of said levels according to said time.

According to an embodiment, the detection circuit comprises a circuit for storing the first signal representative of said time, in the case where the quantity of charges collected at said time exceeds said threshold, the first signal being an analog signal or a digital signal.

According to an embodiment, the storage circuit comprises a second source of a second discrete signal having a plurality of second levels, at least a capacitor and a circuit for charging the capacitor with one of said second levels according to said time, in the case where the quantity of charges collected at said time exceeds said threshold.

According to an embodiment, for each pixel, the readout circuit comprises a fourth MOS transistor having its gate coupled to the first node and the detection circuit comprises a fifth MOS transistor having its gate coupled to the second node.

According to an embodiment, the detection circuit comprises a first switch coupling one of the terminals between the source and the drain of the fifth MOS transistor to the source of the first reference potential and a second switch coupling the other terminal between the source and the drain of the fifth MOS transistor to a source of a second reference potential.

An embodiment also provides a method of image acquisition by an image sensor comprising pixels, each pixel comprising a photodetector and a circuit for reading out the quantity of charges collected by the photodetector at the end of a phase of charge collection by the photodetector, the method comprising the following steps, carried out for at least one of the pixels:

a) detecting, at least at each of two different times during said phase, whether the quantity of charges collected at said time by the photodetector of said pixel exceeds a threshold; and b) in the case where the quantity of charges collected at said time by the photodetector exceeds the threshold, storing a first signal representative of said time and resetting the photodetector.

According to an embodiment, for each pixel, the readout circuit comprises at least one first transistor coupling the photodetector to a first node. Each pixel further comprises a second transistor coupling the photodetector to a second node, said second node of at least one of the pixels being coupled to the detection circuit. At step a), at each of said times, the second transistor is made at least partially conductive, the first transistor being non-conductive, and, at step b), in the case where the quantity of charges collected at said time exceeds said threshold, the second transistor is made conductive to reset the photodetector.

The foregoing and other features and advantages will be discussed in detail in the following non-limiting description of specific embodiments in connection with the accompanying drawings.

DETAILED DESCRIPTION

Figure 1:
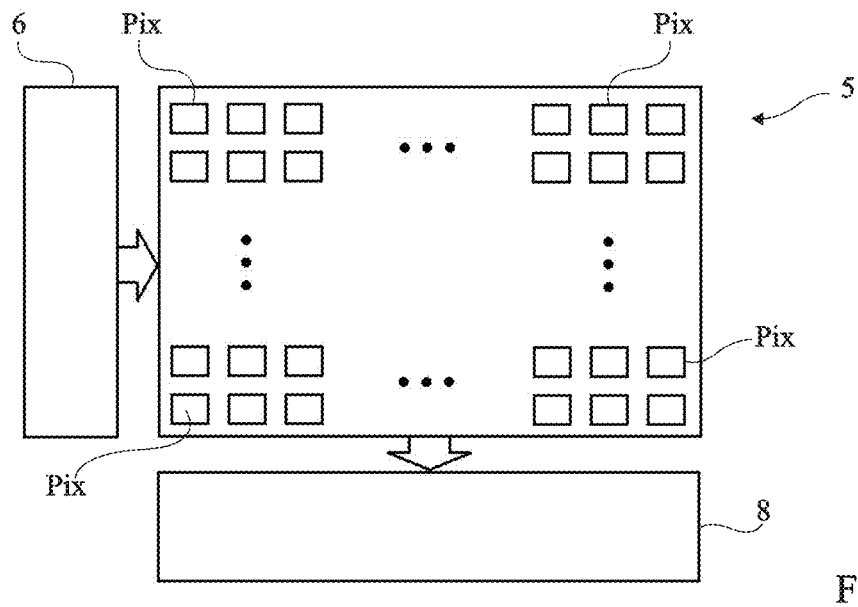
FIG. 1 is a partial electric diagram of an image sensor.

In the following description, only those elements which are necessary to the understanding of the present invention will be described and shown in the drawings. In particular, the circuits for processing the signals read from the pixels are well known by those skilled in the art and are not described in detail hereafter. Further, a signal which alternates between a first constant state, for example, a low state, noted "0", and a second constant state, for example, a high state, noted "1", is called a "binary signal". The high and low states of different binary signals of a same electronic circuit may be different. In particular, the binary signals and the discrete signals may correspond to voltages or to currents which may not be perfectly constant in the high or low state. Further "discrete signal" designates a signal which can only take substantially constant values from among a finite set of values. Further, in the following description, expressions "substantially", "about", "approximately", and "in the order of" are used herein to designate a tolerance of plus or minus 10% of the value in question.

FIG. 1 is an electric diagram of an image sensor 5 comprising pixels Pix, for example, arranged in rows and in columns, a control circuit 6 particularly capable of successively selecting each pixel row and a circuit 8 for reading out the signals stored in the pixels of the selected row.

Figure 2:
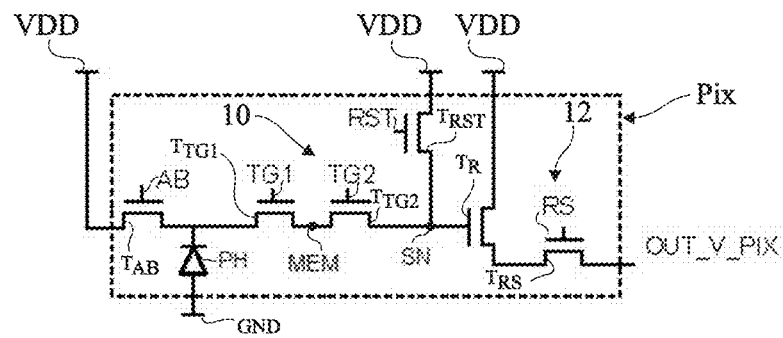
FIG. 2 is a partial electric diagram of a pixel of an image sensor of global shutter type.

FIG. 2 is an electric diagram of an example of a pixel Pix of image sensor 5. The pixel Pix shown in FIG. 2 is adapted to the forming of an image sensor 5 of global shutter type.

Pixel Pix corresponds to a so-called "6T" pixel, that is, having an analog electronic system formed by six metal-oxide-semiconductor field-effect transistors, or MOS transistors.

Pixel Pix comprises a photodetector PH, for example, a photodiode, particularly a pinned photodiode, intended to convert the energy of received incident photons into electron-hole pairs. As a variation, photodetector PH may be a phototransistor. In the present example, the anode of photodiode PH is coupled to a source of a low reference potential GND, for example, the ground.

Pixel Pix also comprises a circuit 10 for reading out the charges generated by photodiode PH. Readout circuit 10 particularly comprises a circuit ensuring the charge and the discharge of photodiode PH as well as the conversion of the charges generated by photodiode PH and stored in its junction capacitor during the integration phase of pixel Pix.

Finally, pixel Pix also comprises a row selection circuit 12 supplying a signal OUT_V_PIX and enabling, on reception of a signal RS corresponding to the row where pixel Pix is located and according to the value of signal RS, to read the luminance information stored by pixel Pix during its integration time.

Row selection circuit 12 for example comprises a MOS transistor $T_{RS}$, for example with an N channel, having its source supplying signal OUT_V_PIX. Readout circuit 10 may comprises a MOS transistor $T_{RST}$, for example, with an N channel, having its source coupled to a sense node SN, having its drain coupled to a source of a high reference potential VDD, and having its gate receiving a signal RST. It further comprises a MOS transistor $T_R$, for example, with an N channel, having its drain coupled to the source of high potential VDD and having its source coupled to the drain of row selection transistor $T_{RS}$. Further, the gate of transistor $T_R$ is coupled to sense node SN. Readout circuit 10 may further comprise a MOS transistor $T_{TG1}$, for example, with an N channel, having its drain coupled to the cathode of photodiode PH, having its source coupled to a node MEM, and having its gate receiving a signal TG1. Readout circuit 10 may further comprise a MOS transistor $T_{TG2}$, for example, with an N channel, having its drain coupled to node MEM, having its source coupled to node SN, and having its gate receiving a signal TG2.

Pixel Pix may further comprise a MOS transistor $T_{AB}$, for example, with an N channel, having its drain coupled to the source of high potential VDD, having its source coupled to the cathode of photodiode PH, and having its gate receiving a signal AB.

Gate control signals AB, TG1, TG2, RS, and RST are supplied by control circuit 6, not shown in FIG. 2.

Figure 3:
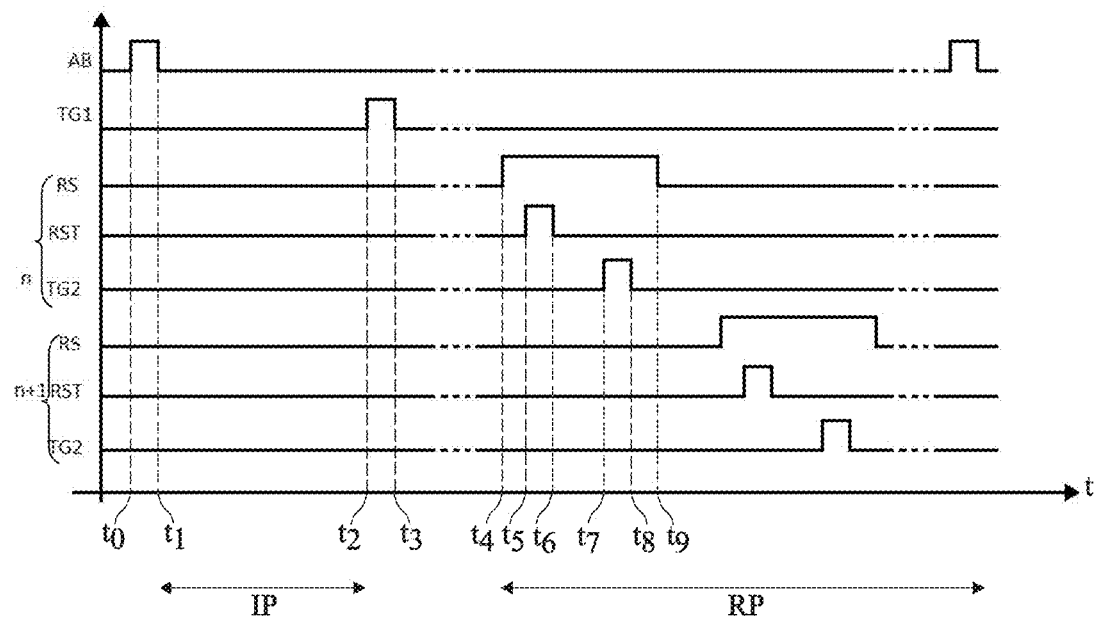
FIGS. 3 and 4 are timing diagrams of control signals of two pixels having the structure shown in FIG. 2, according to two operating modes of the image sensor.

FIG. 3 is a timing diagram illustrating an embodiment of an operating method of image sensor 5. Call $t_0$ to $t_9$ successive times.

At time $t_0$, transistor $T_{AB}$ is set to the on state simultaneously for each pixel Pix of image sensor 5. This enables to reset pixel Pix, the voltage across the junction capacitor of photodiode PH being then equal to the pinch-off voltage of the photodiode.

At time $t_1$, transistor $T_{AB}$ is set to the non-conductive state for each pixel Pix of image sensor 5. This corresponds to the beginning of an integration phase IP for each pixel Pix. The light which reaches the photodetector causes the forming of electron/hole pairs, the storage of the electrons in the junction capacitor of photodiode PH, and a decrease in the voltage across photodiode PH. Transistors $T_{AB}$ and $T_{TG1}$ are sized so that, when photodiode PH reaches its saturation limit, the additional electrons are discharged by transistor $T_{AB}$ rather than by transistor $T_{TG1}$.

At time $t_2$, transistor $T_{TG1}$ is set to the conductive state simultaneously for each pixel Pix of image sensor 5. The charges stored in photodiode PH are at least partially transferred to node MEM. This corresponds to the end of integration phase IP for each pixel Pix.

At time $t_3$, transistor $T_{TG1}$ is set to the non-conductive state simultaneously for each pixel Pix of image sensor 5. Node MEM keeps the charges transmitted by photodiode PH while waiting for the readout phase.

A phase RP of reading a signal representative of the charges at node MEM is carried out for each pixel Pix row after row. As an example, FIG. 3 illustrates the reading of the potentials at nodes MEM of pixels of two adjacent pixel rows of rank n and n+1.

At time $t_4$, transistor $T_{RS}$ is set to the conductive state for each pixel of the row of rank n, which starts the phase of reading of the pixels of the row of rank n. Transistor $T_R$ forms a voltage follower converting the potential at node SN into a voltage which can be found at the source of transistor $T_R$.

At time $t_5$, transistor $T_{RST}$ is set to the conductive state for each pixel Pix of the row of rank n. This enables to reset node SN, the voltage at node SN being then set to VDD. The potential at node SN is representative of the quantity of charges stored in photodiode PH.

At time $t_6$, transistor $T_{RST}$ is set to the non-conductive state for each pixel Pix of the row of rank n. This sets the potential at node SN. The voltage of voltage OUT_V_PIX follows the potential at node SN. A first reading of voltage OUT_V_PIX is then carried out by readout circuit 8.

At time $t_7$, transistor $T_{TG2}$ is set to the conductive state for each pixel Pix of the row of rank n. This causes a charge transfer from node MEM to node SN.

At time t8, transistor $T_{TG2}$ is set to the non-conductive state for each pixel Pix of the row of rank n. This sets the level of the potential of node SN. The voltage of voltage OUT_V_PIX follows the potential at node SN. A second reading of voltage OUT_V_PIX is then carried out by readout circuit 8.

At time $t_9$, transistor $T_{RS}$ is set to the non-conductive state for each pixel of the row of rank n, which ends the phase of reading out from the pixels of the row of rank n.

The same variation sequence of signals RS, RST, and TG2 is then carried out for the pixels Pix of the row of rank n+1.

A signal representative of the quantity of charges stored in photodiode PH is obtained by determining the difference between the first and second readings of voltage OUT_V_PIX. The reset noise level (or kTC noise) at node SN being the same for the first and second readings, it is suppressed on determination of the differential signal. A low noise level of the differential signal can be obtained.

Figure 4:
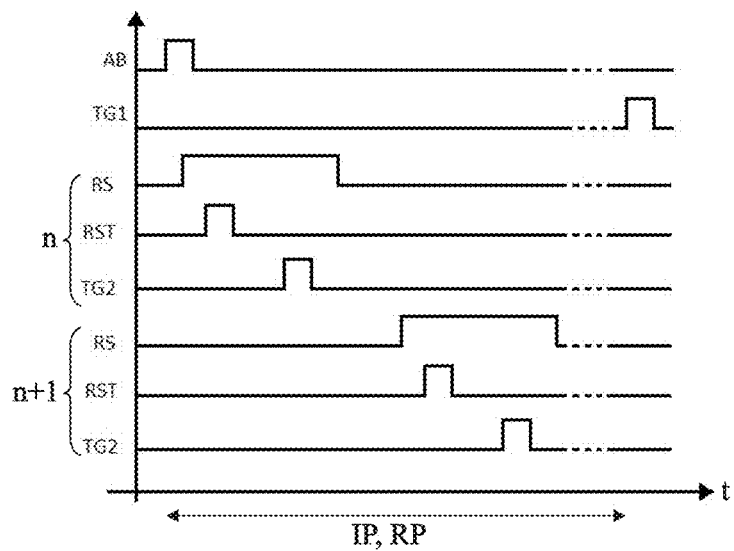

FIG. 4 is a timing diagram illustrating an embodiment of an operating method of IWR-type image sensor 5. The timing diagram shown in FIG. 4 is identical to that shown in FIG. 3, with the difference that the phase RP of reading out from nodes SN of the pixels of the image sensor is carried out at least partly simultaneously with integration phase IP of the pixels of image sensor 5. The potentials at the nodes SN which are read during readout phase RP are those obtained at the end of the previous integration phase. The speed of the image sensor implementing an IWR readout method such as illustrated the timing diagram of FIG. 4 is greater than that of the image sensor implementing the readout method illustrated by the timing diagram of FIG. 3.

Figure 5:
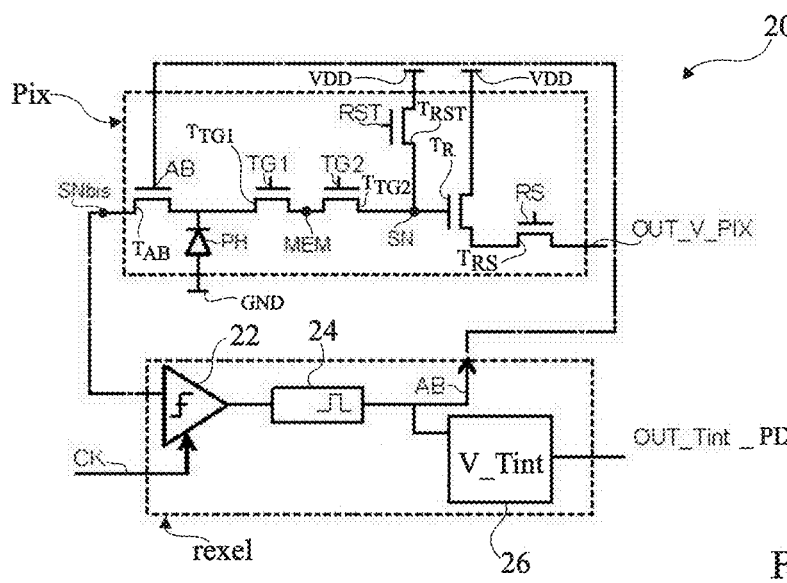
FIG. 5 is a partial electric diagram of an embodiment of an image sensor implementing a dynamic range extension method.

FIG. 5 is an electric diagram of an embodiment of an image sensor 20 implementing a dynamic range extension method. Sensor 20 comprises all the elements of the image sensor 5 shown in FIG. 2 and further comprises, for each pixel Pix, a circuit rexel for detecting an overflow of pixel Pix. According to another embodiment, image sensor 20 may only comprise a circuit rexel for some of pixels Pix. According to another embodiment, circuit rexel may be coupled to a plurality of pixels Pix.

Although the pixel Pix shown in FIG. 5 is of "6T" type, pixel Pix may have a different structure. According to another embodiment, transistor $T_{TG1}$ is not present. However, a disadvantage of such a pixel is that it does not enable to perform a differential reading. According to another embodiment, the conversion of the charges stored at node SN into voltage OUT_V_PIX may be carried out by other means than those shown in FIG. 2. As an example, the readout principle illustrated in FIG. 3 of document US 2013/119233 may be implemented.

Circuit rexel is capable of detecting a possible overflow of the charges stored in photodiode PH via transistor $T_{AB}$.

According to an embodiment, circuit rexel comprises a comparison circuit 22 controlled by a signal CK and having an input coupled to a node SNbis, itself coupled to the drain of transistor $T_{AB}$. The output of comparison circuit 22 is coupled to a circuit 24 supplying control signal AB. The output of comparison circuit 22 is further coupled to a circuit 26 for supplying a signal OUT_Tint_PIX representative of the effective duration of integration of pixel Pix. According to an embodiment, signal OUT_Tint_PIX is a digital signal. According to another embodiment, signal OUT_Tint_PIX is an analog signal supplied by circuit 26 from discrete signal V_Tint.

Figure 6:
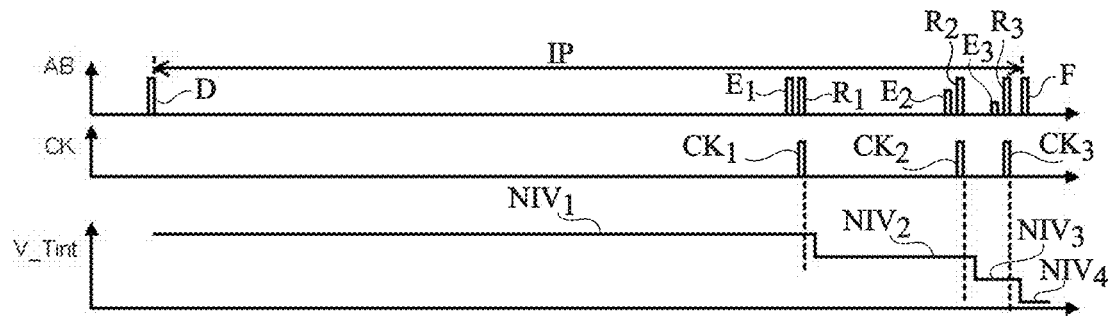
FIG. 6 is a timing diagram of control signals according to an embodiment of an operating method of the image sensor shown in FIG. 5.

FIG. 6 is a timing diagram of control signals according to an embodiment of an operating method of the image sensor 20 shown in FIG. 5.

During an integration phase IP of pixel Pix, delimited by pulses D and F and of signal AB, a plurality of pulses of signal AB are performed to detect whether the quantity of charges collected by photodiode PH would be close to the saturation limit of photodiode PH at the end of the integration phase if the present embodiment of the operating method of image sensor 20 was not implemented. Such pulses are called detection pulses hereafter, three detection pulse $E_1$, $E_2$, $E_3$ are shown in FIG. 6. Each detection pulse $E_1$, $E_2$, $E_3$ of signal AB is followed by a pulse $CK_1$, $CK_2$, $CK_3$ of signal CK. Each detection pulse $E_1$, $E_2$, $E_3$ of signal AB makes transistor $T_{AB}$ at least partially conductive and may cause a charge transfer from photodiode PH to node SNbis, and thus a variation in the potential of node SNbis. The quantity of transferred charges depends on the level of the detection pulse and on the quantity of charges collected by photodiode PH. The quantity of charges transferred to node SNbis is representative of an "excess" of charges collected by photodiode PH, that is, representative of the fact that photodiode PH would be close to the saturation limit at the end of the integration phase if the present embodiment of the operating method of image sensor 20 was not implemented.

The potential at node SNbis is directly or indirectly compared with a threshold by comparison circuit 22. According to the result of the comparison, the output of comparison circuit 22 may switch during pulse $CK_1$, $CK_2$, $CK_3$ if an excess of charges collected by photodiode PH is detected. A switching of the output of comparison circuit 22 causes the application of a pulse $R_1$, $R_2$, $R_3$ of signal AB to reset photodiode PH, called reset pulses hereafter. FIG. 6 shows three reset pulses $R_1$, $R_2$, $R_3$ of signal AB, which means that signal Pix is reset three times in addition to the resetting which has taken place at the beginning of the integration phase. This can be obtained in the case where pixel Pix is exposed to a radiation of high intensity. In the case where pixel Pix is exposed to a radiation of lower intensity, signal AB may exhibit a single pulse or two pulses from among pulses $R_1$, $R_2$, $R_3$, or even none of pulses $R_1$, $R_2$, $R_3$. For each reset pulse $R_1$, $R_2$, $R_3$ of signal AB, circuit 26 supplies a signal OUT_Tint_PIX representative of the effective integration time of photodiode PH since the last resetting of the pixel. In the case where circuit 26 supplies signal OUT_Tint_PIX from signal V_Tint, signal V_Tint may be a discrete voltage having its level varying little after the end of each pulse $CK_1$, $CK_2$ and $CK_3$, each level of signal V_Tint being representative of the time of occurrence of a pulse of signal CK. Four successively decreasing levels $NIV_1$, $NIV_2$, $NIV_3$, $NIV_4$ of signal V_Tint have been shown in FIG. 6.

A readout operation then comprises reading signal OUT_V_PIX, for example, according to the readout methods previously described in relation with FIG. 3 or 4, and reading signal OUT_Tint_PIX. The total quantity of charges collected by the photodiode during the integration phase can then be determined from signals OUT_V_PIX and OUT_Tint_PIX.

The number of detection pulses $E_1$, $E_2$, $E_3$ of signal AB during each integration phase IP may vary from two to 10.

Preferably, during an integration phase IP, detection pulses $E_1$, $E_2$, $E_3$ are not regularly distributed along integration phase IP. Preferably, during an integration phase IP, the duration between two detection pulses decreases along the integration phase. A larger number of detections is thus carried out at the end of the integration phase, when the risk for the photodiode to saturate is higher. According to an embodiment, successively considering each detection pulse from the last detection pulse to the first detection pulse, the time between the detection pulse and end pulse F follows a geometric progression.

According to an embodiment, the levels of detection pulses $E_1$, $E_2$, $E_3$ of signal AB are not identical for each detection pulse. According to an embodiment, during an integration phase, the level of each detection pulse $E_1$, $E_2$, $E_3$ decreases along the integration phase. Thereby, transistor $T_{AB}$ will be less conductive at the second detection pulse $E_2$ than at the first detection pulse $E_1$ and so on, and charges will only be transferred, at the second detection pulse $E_2$, to node SNbis from photodiode PH in the case where photodiode PH is closer to saturation than for the first detection pulse $E_1$. This enables to avoid positive detections at the detection pulses which follow the first pulse while the intensity of the light signal reaching the pixel is sufficiently low not to narrowly cause a positive detection at the first detection pulse.

According to another embodiment, the levels of detection pulses $E_1$, $E_2$, $E_3$ of signal AB are substantially identical for each detection pulse. Circuit rexel may then comprise a circuit capable of preventing the occurrence of reset pulse $R_2$, and possibly of subsequent reset pulses, in the case where there has been no first reset pulse $R_1$.

Figure 7:
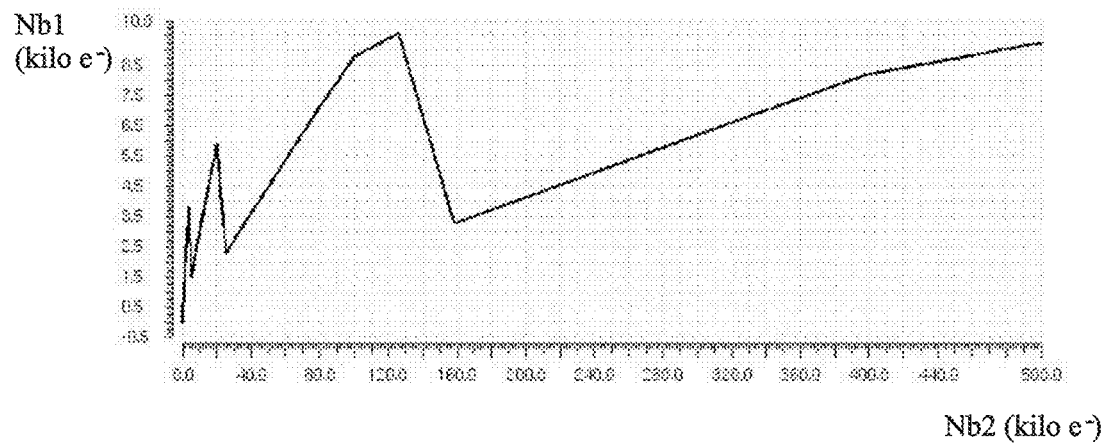
FIG. 7 is a variation curve, obtained by simulation, of the number of electrons received at sense node SN of the pixel shown in FIG. 5 according to the total number of electrons received by the photodiode of the pixel.

FIG. 7 is a variation curve, obtained by simulation, for the pixel shown in FIG. 5, of number Nb1 of electrons (expressed in kilo electrons) received at sense node SN at the end of the integration phase according to the total number Nb2 of electrons (expressed in kilo electrons) received by photodiode PH during the integration phase.

Such a simulation has been obtained by considering the following parameters:

photodiode PH saturating at 9,000 electrons;
time between pulses D and F of 2.16 ms;
three detection pulses of pulse F respectively spaced apart by 360 µs, 60 µs, and 10 µs.

In FIG. 7, each abrupt decrease in the curve means that the pixel has been reset.

When the dynamic range extension method is not implemented, the dynamic range of the pixel is approximately 9,000 electrons. When the dynamic range extension method is implemented, the obtained dynamic range is approximately 450,000 electrons, that is, an increase of more than 34 dB. Further, the signal-to-noise ratio remains greater than 28 dB when the dynamic range extension method is implemented.

According to an embodiment, image sensor 20 may implement an image acquisition method of global shutter type, that is, a pixel control method where the beginnings and ends of the pixel integration phases are simultaneous. In the case of an image acquisition method of global shutter type where pulses D and F of signal AB are substantially simultaneous for all the lines of image sensor 20, it may be advantageous for signals CK to be slightly offset from one row to another, to smooth the power consumption of the image sensor and avoid the generation of power consumption peaks.

According to another embodiment, the image acquisition method may be of "rolling shutter" type wherein the integration phases of the pixel rows are time-shifted with respect to one another. An image acquisition method of rolling shutter type may be implemented in particular with the "6T" pixel structure shown in FIG. 5.

Image sensor 20 may be formed according to a so-called three-dimensional technology, for example such as described in patent FR2970598. Image sensor 20 then comprises a stack of at least two stacked silicon layers. The pixels may be totally or partly formed in the first silicon layer and circuits rexel may be totally or partly formed in the second silicon layer.

Figure 8:
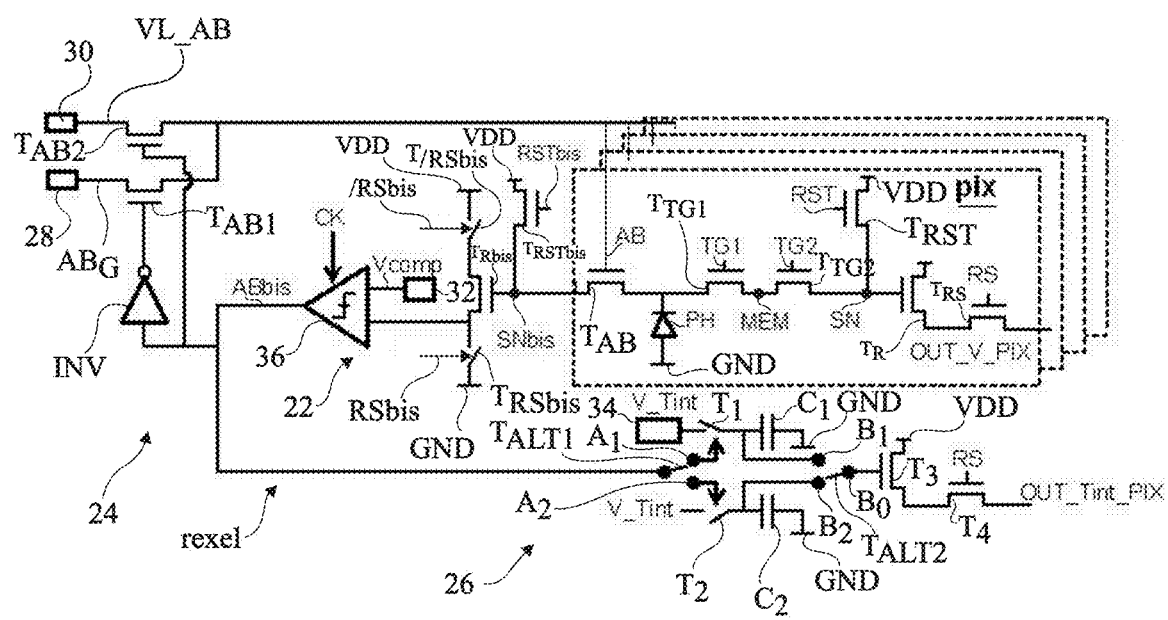
FIG. 8 is a partial electric diagram of a more detailed embodiment of the image sensor of FIG. 5.

FIG. 8 is an electric diagram of a more detailed embodiment of image sensor 20. According to an embodiment, circuit rexel is common to a plurality of pixels, four, as an example, in FIG. 8. The transistors $T_{AB}$ of these four pixels Pix may be coupled to node SNbis. In this case, the sum of the overflows of the four pixels can be observed. As a variation, only the transistor $T_{AB}$ of one of the four pixels Pix, called referrer pixel, is coupled to node SNbis. In this case, only the overflow of the referrer pixel can be observed. However, the four pixels Pix can be reset each time the overflow of the referrer pixel is detected.

Image sensor 20 comprises a source 28 of a discrete signal $AB_G$, for example, a voltage, which may take a plurality of constant values, and a source 30 of a constant signal VL_AB, equal to the low level of signal AB.

Image sensor 20 further comprises a source 32 of a constant comparison signal Vcomp, for example, a constant voltage. Image sensor 20 further comprises a source 34 of a discrete signal V_Tint, for example, a voltage, which may take a plurality of constant values.

Each circuit rexel comprises a MOS transistor $T_{RSTbis}$ having its drain coupled to the source of high reference potential VDD, having its source coupled to node SNbis, and having its gate receiving signal RSTbis.

Comparison circuit 22 comprises:

a MOS transistor $T_{Rbis}$ having its gate coupled to node SNbis;

a switch $T_{RSbis}$ which couples the source of transistor $T_{Rbis}$ to the source of low reference potential GND and which is controlled by a control signal RSbis;

a switch $T_{/RSbis}$ which couples the drain of transistor $T_{Rbis}$ to the source of high reference potential VDD and which is controlled by a control signal /RSbis; and a comparator 36 controlled by signal CK receiving at a first input the signal at the source of transistor $T_{Rbis}$, receiving at a second input a comparison signal Vcomp, and having its output supplying signal ABbis, for example, a binary signal.

Signal /RSbis may correspond to the complement of signal RSbis. Generally, signals /RSbis and RSbis are such that transistors $T_{RSbis}$ and $T_{/RSbis}$ are not simultaneously conductive.

According to an embodiment, when signal CK is at a first level, for example, at the low level, signal ABbis supplied by comparator 36 is independent from the signals at the inputs of comparator 36 and is for example at the low level. When signal CK switches from the first level to a second level, for example, during a rising edge from the low level to the high level, signal ABbis supplied by comparator 36 depends on the comparison of the signals at the input of comparator 36 and is, for example, at the low state when the voltage at the source of transistor $T_{Rbis}$ is greater than voltage Vcomp and is in the high state when the voltage at the source of transistor $T_{Rbis}$ is smaller than voltage Vcomp. The value of signal ABbis at the edge of signal CK from the first level to the second level is maintained as long as signal CK is at the second level.

According to the present embodiment, circuit 24 supplying control signal AB comprises:

an inverter INV having its input coupled to the output of comparator 36;

a MOS transistor $T_{AB1}$ having one of its control terminals (source or drain) coupled to source 28 of discrete signal $AB_G$, having its other control terminal coupled to the gate of the transistor $T_{AB}$ of each pixel Pix associated with circuit rexel, and having its gate coupled to the output of inverter INV; and a MOS transistor $T_{AB2}$ having one of its control terminals (source or drain) coupled to source 30 of binary signal VL_AB, having its other control terminal coupled to the gate of the transistor $T_{AB}$ of each pixel Pix associated with circuit rexel, and having its gate coupled to the output of comparator 36.

According to the present embodiment, circuit 26 for supplying signal OUT_Tint_PIX comprises:

a switch $T_{ALT1}$ alternately coupling the output of comparator 36 to a node $A_1$ or to a node $A_2$;

a switch $T_1$ controlled by the signal at node $A_1$ and coupling source 34 of signal V_Tint to a first electrode of a capacitor $C_1$ having its second electrode coupled to the source of low potential GND;

a switch $T_2$ controlled by the signal at node $A_2$ and coupling source 34 of signal V_Tint to a first electrode of a capacitor $C_2$ having its second electrode coupled to the source of low potential GND;

a switch $T_{ALT2}$ alternately coupling a node $B_0$ to a node $B_1$ coupled to the first electrode of capacitor $C_1$ or to a node $B_2$ coupled to the first electrode of capacitor $C_2$, switch $T_{ALT2}$ being coupled to node $B_2$ when switch $T_{ALT1}$ is coupled to node $A_1$ and switch $T_{ALT2}$ being coupled to node $B_1$ when switch $T_{ALT1}$ is coupled to node $A_2$;

a follower-assembled MOS transistor $T_3$, for example, with an N channel, having its drain coupled to the source of high reference potential VDD and having its gate coupled to node $B_0$; and a MOS transistor $T_4$, for example, with an N channel, having its drain coupled to the source of transistor $T_3$, having its source supplying signal OUT_Tint_PIX, and having its gate receiving signal RS.

An embodiment of an operating method of the image sensor 20 shown in FIG. 8 will now be described. The operation of image sensor 20 is identical to what has been previously described in relation with the timing diagram of FIG. 6.

Outside of the pulses of signal CK, signal ABbis is maintained at the low level so that transistor $T_{AB1}$ is made conductive and transistor $T_{AB2}$ is made non-conductive. Signal AB is then equal to signal $AB_G$. As an example, the positions of switches $T_{ALT1}$ and $T_{ALT2}$ alternate at each integration phase. As an example, at an integration phase, switch $T_{ALT1}$ is coupled to node $A_1$ and switch $T_{ALT2}$ is coupled to node $B_2$ and, at the next integration phase, switch $T_{ALT1}$ is coupled to node $A_2$ and switch $T_{ALT2}$ is coupled to node $B_1$.

As an example, each switch $T_1$ and $T_2$ is conductive when the signal which controls it is in the low state during a pulse of signal CK and is non-conductive when the signal which controls it is in the high state during a pulse of signal CK. Outside of the pulses of signal CK, switches $T_1$ and $T_2$ are non-conductive.

Figure 9:
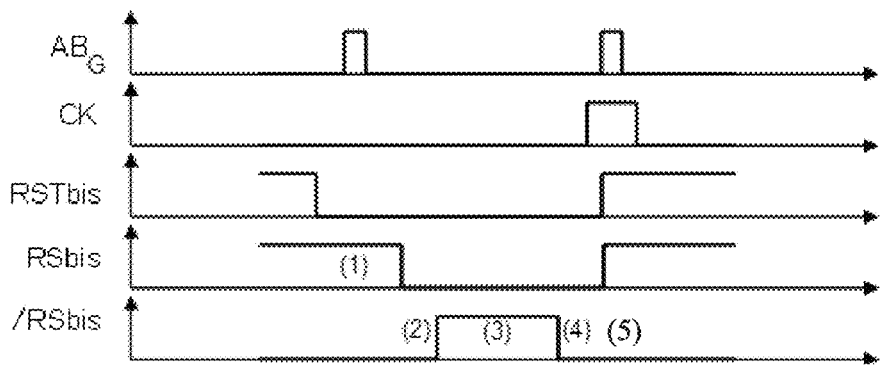
FIG. 9 is a timing diagram of control signals according to an embodiment of an operating method of the image sensor shown in FIG. 8.
Figure 10:
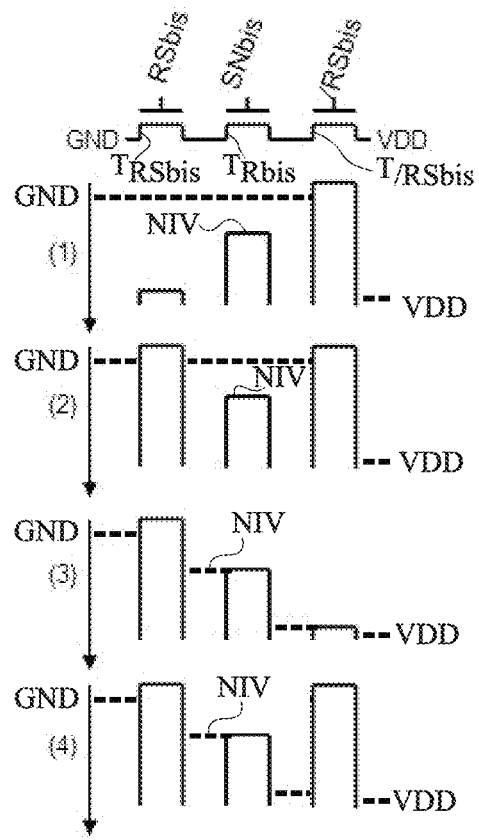
FIG. 10 illustrates voltage levels of transistors of the image sensor shown in FIG. 8 at different successive times.

FIG. 9 is a timing diagram of control signals of the image sensor 20 shown in FIG. 8 at the level of a detection pulse $E_1$ of signal $AB_G$ and of the following pulse $CK_1$ of signal CK. FIG. 10 illustrates the variation of the potential levels at the drain, source, and channel regions of transistors $T_{RSbis}$, $T_{Rbis}$, and $T_{/RSbis}$.

Before a detection pulse $E_1$ of signal $AB_G$, signal RSTbis, which was in the high state, switches to the low state so that transistor $T_{RSTbis}$ is non-conductive. During detection pulse $E_1$ of signal $AB_G$, signal RSbis is in the high state and signal /RSbis is in the low state. This corresponds to configuration (1) of the potentials in FIG. 10. The potential at node SNbis is at a level NIV which depends on the quantity of charges having transited from photodiode PH to node SNbis. At the end of detection pulse $E_1$, the potential at node SNbis does not substantially vary. After detection pulse $E_1$, signal RSbis switches to the low level, which corresponds to the configuration (2) of the potentials in FIG. 10, after which signal /RSbis switches to the high level, which corresponds to configuration (3) of the potentials in FIG. 10. The potential at the source of transistor $T_{Rbis}$ varies up to level NIV to follow the potential at node SNbis. Signal /RSbis then switches back to the high level, which corresponds to configuration (4) of the potentials in FIG. 10. The potential at the source of transistor $T_{Rbis}$ does not substantially vary.

Pulse $CK_1$ then takes place. According to the result of the comparison between signal Vcomp and the potential at the source of transistor $T_{Rbis}$ at the rising edge of pulse CK1, the output of comparator 26 remains at the low level and switches to the high level and signal AB is equal to signal $AB_G$ or to signal VL_AB. Little after the rising edge of pulse $CK_1$, signal RSTbis switches to the high state and signal RSbis switches to the high state. This however causes no change in the output of comparator 36, which remains blocked all along pulse $CK_1$.

Reset pulse $R_1$ then takes place for signal $AB_G$. According to the output of comparator 36, reset pulse $R_1$ is transmitted or not to signal AB according to the result of the comparison between switch Vcomp and the potential at the source of transistor $T_{Rbis}$. When the pulse is transmitted to signal AB, transistor $T_{AB}$ is made at least partially conductive so that photodiode PH is emptied of its charges via the source of high reference potential VDD and is reset.

The present embodiment of detection of the "overflow" of photodiode PH using transistor $T_{Rbis}$ and switches $T_{RSbis}$ and $T_{/RSbis}$ has the advantage of a low power consumption since the modification of the potential at one of the inputs of comparator 36 is obtained with no circulation of current using a current source.

Specific embodiments of the present invention have been described. Various alterations, modifications, and improvements will readily occur to those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An image sensor comprising pixels, each pixel comprising a photodetector and a circuit for reading out the quantity of charges collected by the photodetector at the end of a phase of charge collection by the photodetector, the image sensor further comprising, for at least one of the pixels, a detection circuit capable, at least at each of two different times during said phase, of detecting whether the quantity of charges collected at said time by the photodetector of said pixel exceeds a threshold and, in the case where said quantity of charges collected at said time exceeds the threshold, of storing a first signal representative of said time and of resetting the photodetector, wherein, for each pixel, the readout circuit comprises at least one first transistor coupling the photodetector to a first node and wherein each pixel further comprises a second transistor, different from the first transistor, coupling the photodetector to a second node that is different from the first node, said second node of at least one of the pixels being coupled to the detection circuit, the image sensor further comprising a third transistor coupling the second node to a source of a first reference potential, wherein the detection circuit is capable, for each of said times, of making the second transistor and the third transistor conductive in the case where the quantity of charges collected at said time exceeds said threshold.

2. The image sensor of claim 1, wherein the detection circuit is capable, for each of said times, of making the second transistor at least partially conductive, the third transistor being then non-conductive, and then of making the second transistor and the third transistor conductive in the case where the quantity of charges collected at said time exceeds said threshold.

3. The image sensor of claim 1, comprising a comparator and a circuit for controlling the second transistor from the signal supplied by the comparator.

4. The image sensor of claim 1, comprising a first source of a first discrete signal having a plurality of first levels and wherein the detection circuit is capable of controlling the second transistor with one of said first levels according to said time.

5. The image sensor of claim 1, wherein the detection circuit comprises a circuit for storing the first signal representative of said time, in the case where the quantity of charges collected at said time exceeds said threshold, the first signal being an analog signal or a digital signal.

6. The image sensor of claim 5, wherein the storage circuit comprises a second source of a second discrete signal having a plurality of second levels, at least a capacitor and a circuit for charging the capacitor with one of said second levels according to said time, in which case the quantity of charges collected at said time exceeds said threshold.

7. The image sensor of claim 1, wherein, for each pixel, the readout circuit comprises a fourth MOS transistor having its gate coupled to the first node and wherein the detection circuit comprises a fifth MOS transistor having its gate coupled to the second node.

8. The image sensor of claim 7, wherein the detection circuit comprises a first switch coupling one of the terminals between the source and the drain of the fifth MOS transistor to the source of the first reference potential and a second switch coupling the other terminal between the source and the drain of the fifth MOS transistor to a source of a second reference potential.

9. The image sensor of claim 1, further comprising said detection circuit for each pixel.

10. The image sensor of claim 1, wherein said the detection circuit is coupled only to four pixels.

11. A method of image acquisition by an image sensor comprising pixels, each pixel comprising a photodetector and a circuit for reading out the quantity of charges collected by the photodetector at the end of a phase of charge collection by the photodetector, the method comprising the following steps, carried out for at least one of the pixels:
   a) detecting, at least at each of two different times during said phase, whether the quantity of charges collected at said time by the photodetector of said pixel exceeds a threshold; and
   b) in the case where the quantity of charges collected at said time by the photodetector exceeds the threshold, storing a first signal representative of said time and resetting the photodetector, wherein, for each pixel, the readout circuit comprises at least one first transistor coupling the photodetector to a first node, wherein each pixel further comprises a second transistor coupling the photodetector to a second node, said second node of at least one of the pixels being coupled to the detection circuit;
wherein, at step a), at each of said times, the second transistor is made at least partially conductive, the first transistor being non-conductive, and wherein, at step b), in the case where the quantity of charges collected at said time exceeds said threshold, the second transistor is made conductive to reset the photodetector.

* * * * *